United States Patent
Kandaka

(10) Patent No.: US 10,353,120 B2
(45) Date of Patent: Jul. 16, 2019

(54) OPTICAL ELEMENT, PROJECTION OPTICAL SYSTEM, EXPOSURE APPARATUS, AND DEVICE MANUFACTURING METHOD

(71) Applicant: NIKON CORPORATION, Tokyo (JP)

(72) Inventor: Noriaki Kandaka, Sagamihara (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 14/930,967

(22) Filed: Nov. 3, 2015

(65) Prior Publication Data

US 2016/0054488 A1  Feb. 25, 2016

Related U.S. Application Data

(63) Continuation of application No. PCT/JP2014/062447, filed on May 9, 2014.

(30) Foreign Application Priority Data

May 9, 2013  (JP) ................. 2013-099216

(51) Int. Cl.
*F21V 9/06* (2018.01)
*G02B 5/08* (2006.01)
(Continued)

(52) U.S. Cl.
CPC ......... *G02B 5/0891* (2013.01); *G02B 5/0816* (2013.01); *G03F 1/24* (2013.01); *G03F 1/52* (2013.01); *G03F 7/2004* (2013.01); *G03F 7/32* (2013.01); *G03F 7/70316* (2013.01); *G21K 1/062* (2013.01); *G21K 1/067* (2013.01)

(58) Field of Classification Search
CPC .... G02B 13/14; G02B 13/143; G02B 13/146; G02B 5/208; G02B 5/281; G02B 5/282; G02B 5/283; B82Y 10/00
USPC ............... 359/350, 359, 361, 584, 586, 588; 355/67
See application file for complete search history.

(56) References Cited

U.S. PATENT DOCUMENTS 6,208,407 B1  3/2001  Loopstra
6,262,796 B1  7/2001  Loopstra et al.
(Continued)

FOREIGN PATENT DOCUMENTS

EP   2 068 326 A1   6/2009
EP   2 115 751      5/2015
(Continued)

OTHER PUBLICATIONS

English-language International Search Report from the Japanese Patent Office, dated Jul. 8, 2014, for International Application No. PCT/JP2014/062447.
(Continued)

*Primary Examiner* — Audrey Y Chang
(74) *Attorney, Agent, or Firm* — Finnegan, Henderson, Farabow, Garrett & Dunner, LLP

(57) ABSTRACT

An optical element includes: a base; a multilayer film which is provided on the base and in which a plurality of unit laminate structures are laminated, each laminate structure having a first layer and a second layer provided on the first layer; and a plurality of spacer layers which are each provided at a different one of a plurality of interlaminar positions located between the unit laminate structures.

12 Claims, 9 Drawing Sheets

US 10,353,120 B2
Page 2

(51) Int. Cl.
*G03F 1/24* (2012.01)
*G03F 7/20* (2006.01)
*G03F 7/32* (2006.01)
*G21K 1/06* (2006.01)
*G03F 1/52* (2012.01)

(56) References Cited

U.S. PATENT DOCUMENTS

| | | | |
|---|---|---|---|
| 6,341,007 B1 | 1/2002 | Nishi et al. | |
| 6,400,441 B1 | 6/2002 | Nishi et al. | |
| 6,452,661 B1 | 9/2002 | Komatsuda | |
| 6,549,269 B1 | 4/2003 | Nishi et al. | |
| 6,590,634 B1 | 7/2003 | Nishi et al. | |
| 6,611,316 B2 | 8/2003 | Sewell | |
| 6,897,963 B1 | 5/2005 | Taniguchi et al. | |
| 7,771,896 B2 * | 8/2010 | Soer | B82Y 10/00 430/5 |
| 8,144,830 B2 | 3/2012 | Yakshin et al. | |
| 9,442,383 B2 | 9/2016 | Dinger et al. | |
| 2002/0171922 A1 | 11/2002 | Shiraishi et al. | |
| 2003/0008148 A1 | 1/2003 | Bajt et al. | |
| 2003/0008180 A1 | 1/2003 | Bajt et al. | |
| 2005/0157384 A1 | 7/2005 | Shiraishi et al. | |
| 2005/0174664 A1 * | 8/2005 | Ito | G02B 27/0012 359/883 |
| 2006/0192147 A1 | 8/2006 | Kandaka et al. | |
| 2007/0091421 A1 * | 4/2007 | Hosoya | B82Y 10/00 359/359 |
| 2007/0170378 A1 * | 7/2007 | Bowering | B82Y 10/00 250/504 R |
| 2007/0171327 A1 * | 7/2007 | Matsumodo | B82Y 10/00 349/65 |
| 2008/0151215 A1 | 6/2008 | Soer et al. | |
| 2009/0097104 A1 * | 4/2009 | Kandaka | B82Y 10/00 359/359 |
| 2009/0147364 A1 | 6/2009 | Kotoku et al. | |
| 2010/0027107 A1 | 2/2010 | Yakshin et al. | |
| 2011/0194087 A1 * | 8/2011 | Tsarfati | B82Y 10/00 355/67 |
| 2014/0285783 A1 | 9/2014 | Dinger et al. | |

FOREIGN PATENT DOCUMENTS

| | | |
|---|---|---|
| JP | A-2004-532413 | 10/2004 |
| JP | 2004-356415 | 12/2004 |
| JP | A-2005-516182 | 6/2005 |
| JP | 2007-198784 | 8/2007 |
| JP | 2008-270802 | 11/2008 |
| JP | 2009-141177 | 6/2009 |
| JP | A-2010-514203 | 4/2010 |
| JP | 2010-518594 | 5/2010 |
| JP | A-2011-077552 | 4/2011 |
| KR | 10-2009-0108692 | 10/2009 |
| TW | 201305601 A | 2/2013 |
| WO | WO 02/089149 A1 | 11/2002 |
| WO | WO 2005/038886 A1 | 4/2005 |
| WO | WO 2008/079007 A1 | 7/2008 |
| WO | WO 2008/095663 A1 | 8/2008 |
| WO | WO 2008/133191 | 11/2008 |
| WO | WO 2012/126954 | 9/2012 |

OTHER PUBLICATIONS

Written Opinion of the International Searching Authority issued by The International Bureau of WIPO in International Application No. PCT/JP2014/062447, dated Jul. 8, 2014 (8 pages).
Decision of Rejection issued by the Japanese Patent Office in counterpart Japanese Application No. 2015-515902 dated Oct. 25, 2016, and English translation thereof . . . .
Extended European Search Report in corresponding European Application No. EP 14795365.7 dated Oct. 19, 2016.
Notice of Reasons for Rejection issued in counterpart Japanese Application No. 2015-515902, dated May 31, 2016.
The Notice of Preliminary Rejection issued by the Korean Intellectual Property Office in counterpart Korean Patent Application No. 10-2015-7033754, dated Jul. 12, 2016.
Office Action issued by the Korean Intellectual Property Office in counterpart Korean Patent Application No. 10-2017-7005348 dated Apr. 7, 2017, and English translation thereof.
English Translation of the Notice of Final Rejection, issued by the Korean Intellectual Property Office in counterpart Korean Patent Application No. 10-2015-7033754, dated Jan. 25, 2017 (7 pages).
Office Action issued by the Taiwan Intellectual Property Office in Taiwanese Patent Application No. 103116535 dated Sep. 5, 2017, and English translation thereof.
Office Action dated Oct. 17, 2017 by the Japanese Patent Office in counterpart Japanese Patent Application No. 2017-006495, and English translation thereof.
Office Action dated Oct. 25, 2017 by the Korean Intellectual Property Office in counterpart Korean Patent Application No. 2017-7005348, and English translation thereof.
Notice of Final Rejection dated Feb. 1, 2018, by the Korean Intellectual Property Office in counterpart Korean Patent Application No. 2017-7005348, and English translation thereof.
Notice of Rejection dated Mar. 13, 2018, by the Japanese Patent Office in counterpart Japanese Patent Application No. 2017-006495, and English translation thereof.
Office Action dated Jul. 13, 2018, by the Korean Intellectual Property Office in counterpart Korean Patent Application No. 10-2018-7012287, and English translation thereof.
Notification of Final Rejection issued on Jan. 11, 2019 by the Korean Intellectual Property Office in Korean Application No. 10-2018-7012287 and English translation thereof.
Office Action issued on Mar. 23, 2019 by the Korean Intellectual Property Office in counterpart Korean Patent Application No. 10-2018-7012287, and English translation thereof.

\* cited by examiner

|  | MULTILAYER FILM 1 | MULTILAYER FILM 2 | MULTILAYER FILM 3 | MULTILAYER FILM 4 | MULTILAYER FILM 5 |
|---|---|---|---|---|---|
| PERIODIC BLOCK 1 | 50p | 30p | 25p | 20p | 17p |
| SPACER LAYER (1) | – | 3.8nm | 3.7nm | 3.6nm | 3.6nm |
| PERIODIC BLOCK 2 | – | 8p | 12p | 9p | 8p |
| SPACER LAYER (2) | – | – | 3.7nm | 3.6nm | 3.6nm |
| PERIODIC BLOCK 3 | – | – | 6p | 6p | 8p |
| SPACER LAYER (3) | – | – | – | 3.6nm | 3.6nm |
| PERIODIC BLOCK 4 | – | – | – | 2p | 6p |
| SPACER LAYER (4) | – | – | – | – | 3.6nm |
| PERIODIC BLOCK 5 | – | – | – | – | 2p |

(SURFACE SIDE ↑ / SUBSTRATE SIDE ↓)

OPTICAL ELEMENT, PROJECTION OPTICAL SYSTEM, EXPOSURE APPARATUS, AND DEVICE MANUFACTURING METHOD

CROSS-REFERENCE TO RELATED APPLICATION

This is a Continuation Application of International Application No. PCT/JP2014/062447, filed on May 9, 2014, which claims priority on Japanese Patent Application No. 2013-99216, filed on May 9, 2013. The contents of the aforementioned applications are incorporated herein by reference.

BACKGROUND

Field of the Invention

The present invention relates to an optical element, a projection optical system, an exposure apparatus, and a device manufacturing method.

Background

In exposure apparatuses for use in a photolithography process, EUV exposure apparatuses in which extreme ultraviolet (EUV) light is used as exposure light have been proposed as disclosed, for example, in United States Patent Application, Publication No. 2005/157384. An optical element such as a multilayer-film reflection mirror having a multilayer film capable of reflecting at least part of incident light is used in a projection optical system of a EUV exposure apparatus.

As such a multilayer film, for example, a periodic multilayer film is known. It is known that the periodic multilayer film has a high reflectance with respect to EUV light. The periodic multilayer film has a configuration in which a first layer (for example, a molybdenum layer) and a second layer (for example, a silicon layer) are formed to be periodically laminated. On the other hand, when the NA (numerical aperture) of a projection optical system is larger in order to obtain high resolution, EUV light rays are incident over a wider incident angle range. Therefore, an optical system is required to reflect incident EUV light in a wide incident angle range. However, for example, it is difficult for the multilayer film having a periodic structure to obtain a uniform reflectance in a wide angle range when light having a wavelength close to the wavelength (for example, 13.5 nm) of EUV light is incident in a wide incident angle range.

On the other hand, a wideband film is proposed in order to deal with a wavelength range in which light is incident in a wide incident angle range. As such a wideband film, for example, a non-periodic film structure having layers with a different film thickness is known. In a periodic structure, the parameters of the film structure are two, that is, the thickness of one periodic structure and the thickness ratio of a first layer to a second layer; on the other hand, in the case of a non-periodic structure film, all film thicknesses of several ten layers are parameters.

Since it is required to adjust reflectance properties with high accuracy in a EUV optical system, when forming a multilayer film, the reflectance properties of an actually formed multilayer film are evaluated, and then the film structure of the multilayer film is modified and adjusted such that the reflectance properties approach target properties. In this regard, when forming a multilayer film having a periodic structure, the film structure parameters are limited to the first layer and the second layer (i.e. two layers), and therefore it is easy to modify and adjust the reflectance properties.

SUMMARY

However, in the case of a non-periodic structure multilayer film, it is not easy to clarify which layer has a thickness error that causes the difference between the target reflectance properties and properties obtained by actual measurement of the formed multilayer film, and adjustments of several times are required for making the properties approach the target reflectance properties finally. Therefore, a multilayer film having a film structure that is easily modified and adjusted has been required.

An object of an aspect of the present invention is to provide an optical element, a projection optical system, an exposure apparatus, and a device manufacturing method, which are capable of obtaining a substantially constant reflectance in a wide angle range and have a multilayer film with a film structure that is easily modified and adjusted.

According to a first aspect of the present invention, there is provided an optical element including: a base; a multilayer film which is provided on the base and in which a plurality of unit laminate structures are laminated, each laminate structure having a first layer and as second layer provided on the first layer; and a plurality of spacer layers which are each provided at a different one of a plurality of interlaminar positions located between the unit laminate structures.

According to a second aspect of the present invention, there is provided a projection optical system having a plurality of reflection elements and configured to project an image of a first surface on a second surface, wherein at least one of the plurality of reflection elements is an optical element according to the first aspect of the present invention.

According to a third aspect of the present invention, there is provided an exposure apparatus configured to expose a substrate with exposure light, wherein the exposure apparatus includes an optical element according to the first aspect of the present invention.

According to a fourth aspect of the present invention, there is provided a device manufacturing method including: exposing a substrate using the exposure apparatus according to the third aspect of the present invention; and developing the exposed substrate.

According to an aspect of the present invention, it is possible to provide an optical element, a projection optical system, an exposure apparatus, and a device manufacturing method, which are capable of obtaining a substantially constant reflectance in a wide angle range and have a multilayer film with a film structure that is easily modified and adjusted.

DESCRIPTION OF EMBODIMENTS

[Optical Element]

Hereinafter, embodiments of the present invention are described with reference to diagrams; however, the present invention is not limited thereto. In the following description, an XYZ orthogonal coordinate system is set, and the positional relationship of units is described with reference to the XYZ orthogonal coordinate system. A predetermined direction within a horizontal plane is set as an X-axis direction. A direction orthogonal to the X-axis direction within the horizontal plane is set as a Y-axis direction. A direction orthogonal to both the X-axis direction and the Y-axis direction (that is, a vertical direction) is set as a Z-axis direction. Rotation (tilt) directions around the X-axis, the Y-axis, and the Z-axis are set as θX, θY; and θZ directions, respectively.

Figure 1:
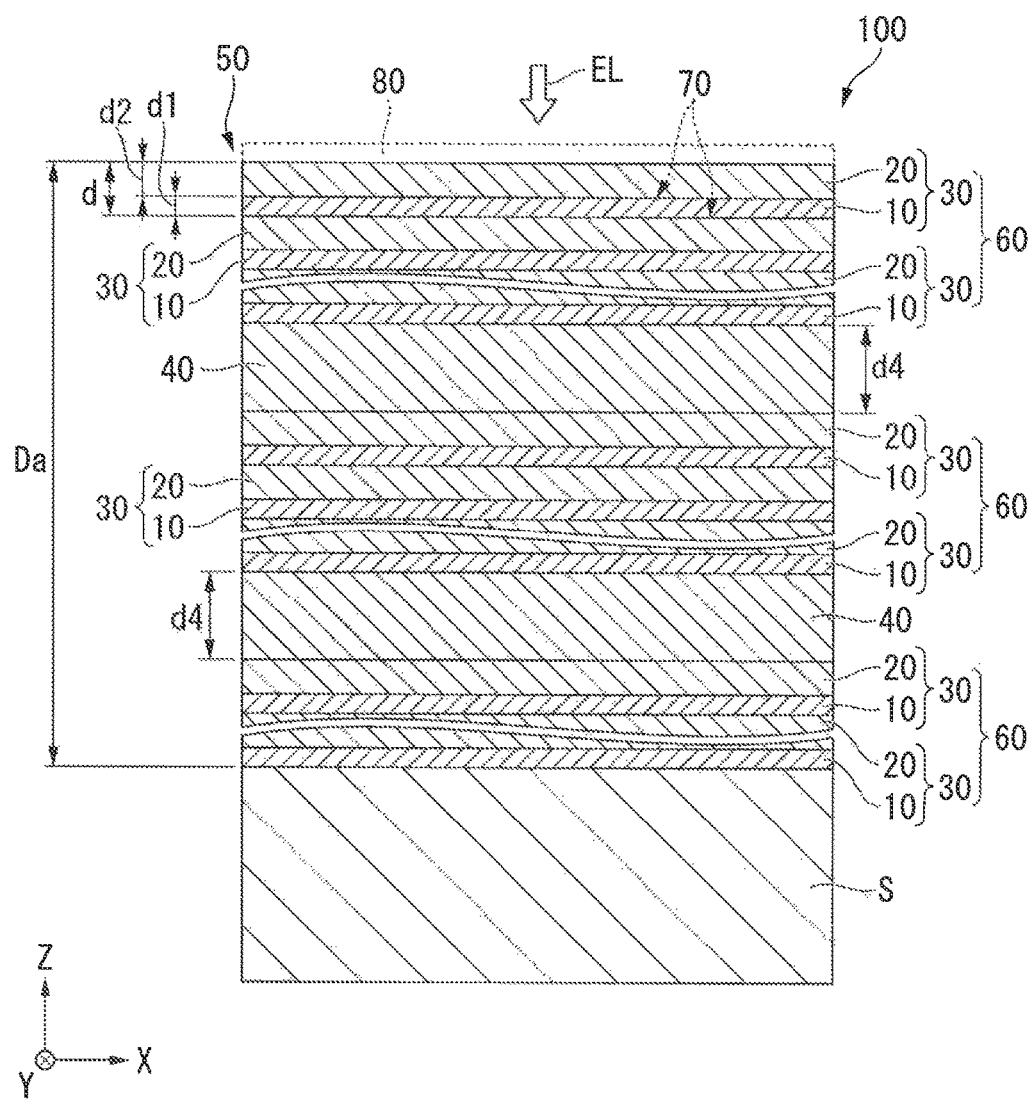
FIG. 1 is a diagram showing an example of an optical element according to a present embodiment.

FIG. 1 is a schematic view showing an example of an optical element 100 according to the present embodiment. In the present embodiment, a multilayer-film reflection mirror is described as an example of the optical element 100. In FIG. 1, the optical element 100 is provided with a base S and a multilayer film 50 including a first layer 10 and a second layer 20 alternately laminated on the base S and capable of reflecting at least part of incident light EL.

In the present embodiment, the light EL incident on the multilayer film 50 includes extreme ultraviolet light. Extreme ultraviolet light is, for example, an electromagnetic wave in a soft X-ray region having a wavelength of approximately 11 to 14 nm. Extreme ultraviolet light is reflected by the multilayer film 50. In the following description, extreme ultraviolet light may be referred to as EUV light.

Here, the light EL incident on the multilayer film 50 may be an electromagnetic wave in a soft X-ray region having a wavelength of approximately 5 to 50 nm or may be an electromagnetic wave having a wavelength of approximately 5 to 20 nm. Further, the light EL may be an electromagnetic wave having a wavelength of 193 nm or less. For example, the light EL may be vacuum ultraviolet light (VUV light) such as ArF excimer laser light (wavelength of 193 nm) and F2 laser light (wavelength of 157 nm).

The base S is, for example, formed of ultra-low expansion glass. As the base S, for example, ULE manufactured by Corning Incorporated, Zerodur (registered trademark) manufactured by Schott AG, or the like is used.

The multilayer film 50 includes the first layer 10 and the second layer 20 alternately laminated with a predetermined periodic length d. The periodic length d refers to the sum (d1+d2) of the thickness d1 of the first layer 10 and the thickness d2 of the second layer 20. Based on the light interference theory, each of the thickness d1 of the first layer 10 and the thickness d2 of the second layer 20 is set such that the reflected waves reflected by interfaces of the first layer 10 and the second layer 20 coincide with one another in phase.

In the following description, one set of the first layer 10 and the second layer 20 is represented as a unit laminate structure 30 as appropriate. In the present embodiment, regarding one unit laminate structure 30, the first layer 10 is arranged on the base S side (on the side in the drawing) with respect to the second layer 20. The unit laminate structure 30 having the first layer 10 and the second layer 20 are laminated on the base S, and thereby the multilayer film 50 having a so-called periodic structure is formed.

For example, several tens to several hundred sets of unit laminate structures 30 are laminated on the base S, As an example, in the present embodiment, 50 sets of unit laminate structures 30 are laminated on the base S.

The first layer 10 is formed of a material having a large difference between a refractive index with respect to EUV light and the refractive index of vacuum. The second layer 20 is formed of a material having a small difference between a refractive index with respect to EUV light and the refractive index of vacuum. In the present embodiment, the first layer (heavy atom layer) 10 is formed of molybdenum (Mo). The second layer (light atom layer) 20 is formed of silicon (Si). That is, the multilayer film 50 of the present embodiment is a Mo/Si multilayer film in which a molybdenum layer (Mo layer) and a silicon layer (Si layer) are alternately laminated.

The refractive index of vacuum n is 1, Further, for example, the refractive index of molybdenum nMo with respect to EUV light having a wavelength of 13.5 nm is 0.92., and the refractive index of silicon nSi is 0.998. In this way, the second layer 20 is formed of a material in which the refractive index with respect to EUV light is substantially equal to the refractive index of a vacuum.

Further, the multilayer film 50 includes a spacer layer 40. The spacer layer 40 is arranged between the unit laminate structures 30. In the multilayer film 50, a plurality of unit laminate structures 30 are laminated.

Accordingly, the multilayer film 50 is provided with a plurality of positions (interlaminar positions) corresponding to a space between such unit laminate structures 30. In the present embodiment, a plurality of spacer layers 40 are each arranged at a different one of such a plurality of interlaminar positions (positions each corresponding to a space between the unit laminate structures 30).

In other words, a first spacer layer of the plurality of spacer layers 40 is arranged at a first interlaminar position of the plurality of interlaminar positions, a second spacer layer that is different from the first spacer layer of the plurality of spacer layers 40 is arranged at a second interlaminar position that is different from the first interlaminar position of the plurality of interlaminar positions. The first spacer layer is arranged at a space between one unit laminate structure 30 and the next unit laminate structure 30, and the second spacer layer is arranged at a space between another unit laminate structure 30 and the next unit laminate structure 30. The distance between a surface of the base S and the first spacer layer is different from the distance between the surface of the base S and the second spacer layer. For example, the second spacer layer is arranged at a position farther from the surface of the base S than the first spacer layer. Similarly, if necessary, a third spacer layer, a fourth spacer layer, and so on can be provided.

The plurality of spacer layers 40 have the same layer thickness d4. The layer thickness d4 is formed to be a dimension corresponding to the thickness (periodic length) of the unit laminate structure 30. Specifically, the layer thickness d4 is a dimension of approximately ⅓ to ⅔ of the periodic length d of the unit laminate structure 30 or is a dimension obtained by adding the dimension to a dimension equal to the optical thickness of the periodic length d. Further, the layer thickness is preferably approximately ⅖ to ⅗ of the periodic length d of the unit laminate structure 30 or is obtained by adding the optical thickness of the periodic length d to ⅖ to ⅗ of the periodic length d. In this way, the spacer layer 40 is formed with a thickness corresponding to the thickness of the unit laminate structure 30.

In the present embodiment, the multilayer film 50 is configured by the plurality of unit laminate structures 30 and the plurality of spacer layers 40 and has a layer thickness Da. The distance from the interface of the base S and the multilayer film 50 to the surface of the multilayer film 50 is equal to the layer thickness Da of the multilayer film 50.

The multilayer film 50 has the plurality of spacer layers 40 to thereby be divided into a plurality of periodic blocks (laminate structure) 60 by the plurality of spacer layers 40. The periodic block 60 is a structure having the plurality of unit laminate structures 30. In the present embodiment, the plurality of periodic blocks 60 are formed according to the plurality of spacer layers 40.

The spacer layer 40 includes a material having an extinction coefficient which is smaller than that of a material constituting the multilayer film 50 in the wavelength of EUV light reflected by the multilayer film 50. Examples of such a material include a material such as C, B, Si, Zr, Nb, and Ru, a compound of the materials, or the like. In the present embodiment, the spacer layer 40 has a configuration in which the spacer layer 40 is formed by Si having a superior extinction coefficient. When the spacer layer 40 is formed of Si, a layer of the same material is formed on the second layer 20 formed also by Si. Accordingly, by forming the Si film such that the thickness of the Si film when forming the second layer 20 is equal to the sum of the thickness of the second layer 20 and the thickness of the spacer layer 40, the second layer 20 and the spacer layer 40 are formed in the same process.

Next, the relationship between the number of spacer layers 40 included in the multilayer film 50 and an incident angle dependence of light (non-polarized light) reflected by the multilayer film 50 is described.

Figures 2, 3:
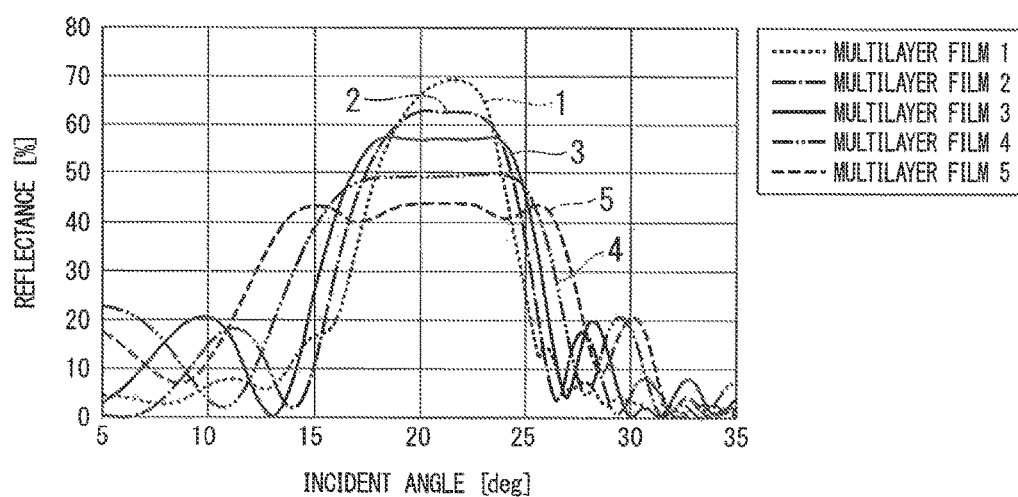
FIG. 2 is a table showing a configuration example of the optical element according to the present embodiment.
FIG. 3 is a diagram showing an example of a relationship between the incident angle of light with respect to a surface of a multilayer film and reflectance.

FIG. 2 is a comparison table showing the number and thickness of spacer layers 40 and the number of unit laminate structures 30 included in the periodic block 60 regarding five types of multilayer films.

Each of multilayer films 1 to 5 is a multilayer film having a periodic structure formed by a Mo (molybdenum) layer and a Si (silicon) layer. In the periodic structure, the thickness of the Mo layer is 3.0 nm, and the thickness of the Si layer is 4.5 nm. The multilayer films 1 to 5 have, for example, an ideal structure in which an interface diffusion layer is not generated between the Mo layer and the Si layer. Further, Si is used as a constituent material of the spacer layer.

As shown in FIG. 2, the multilayer film 1 includes no spacer layer. Therefore, the multilayer film 1 includes one periodic block. Further, the total number of unit laminate structures included in the periodic block is 50.

A multilayer film 2 includes one spacer layer. Therefore, the multilayer film 2 includes two periodic blocks. The total number of unit laminate structures included in the periodic block on the surface side of the multilayer film 2 is 30. Further, the total number of unit laminate structures included in the periodic block arranged on the base S side is 8. Further, the layer thickness of the spacer layer is 3.8 nm, The multilayer film 3 includes two spacer layers. Therefore, the multilayer film 3 includes three periodic blocks. The total number of unit laminate structures included in the periodic block on the surface side of the multilayer film 3 is 25. Further, the total number of unit laminate structures included in the second periodic block from the upper layer of the multilayer film 3 is 12. Further, the total number of periodic blocks arranged on the base S side is 6. Further, the layer thicknesses of the two spacer layers are all 3.7 nm.

A multilayer film 4 includes three spacer layers. Therefore, the multilayer film 4 includes four periodic blocks. The total number of unit laminate structures included in the periodic block on the surface side of the multilayer film 4 is 20. Further, the total number of unit laminate structures included in the second periodic block from the upper layer of the multilayer film 4 is 9. Further, the total number of unit laminate structures included in the third periodic block from the upper layer of the multilayer film 4 is 6. Further, the total number of periodic blocks arranged on the base S side is 2. Further, the layer thicknesses of the three spacer layers are all 3.6 nm.

A multilayer film 5 includes four spacer layers. Therefore, the multilayer film 5 includes five periodic blocks. The total number of unit laminate structures included in the periodic block on the surface side of the multilayer film 5 is 17. Further, the total number of unit laminate structures included in the second periodic block from the upper layer of the multilayer film 5 is 8. Further, the total number of unit laminate structures included in the third periodic block from the upper layer of the multilayer film 5 is 8. Further, the total number of unit laminate structures included in the fourth periodic block from the upper layer of the multilayer film 5 is 6. Further, the total number of periodic blocks arranged on the base S side is 2. Further, the layer thicknesses of the four spacer layers are all 3.6 nm.

Figure 4:
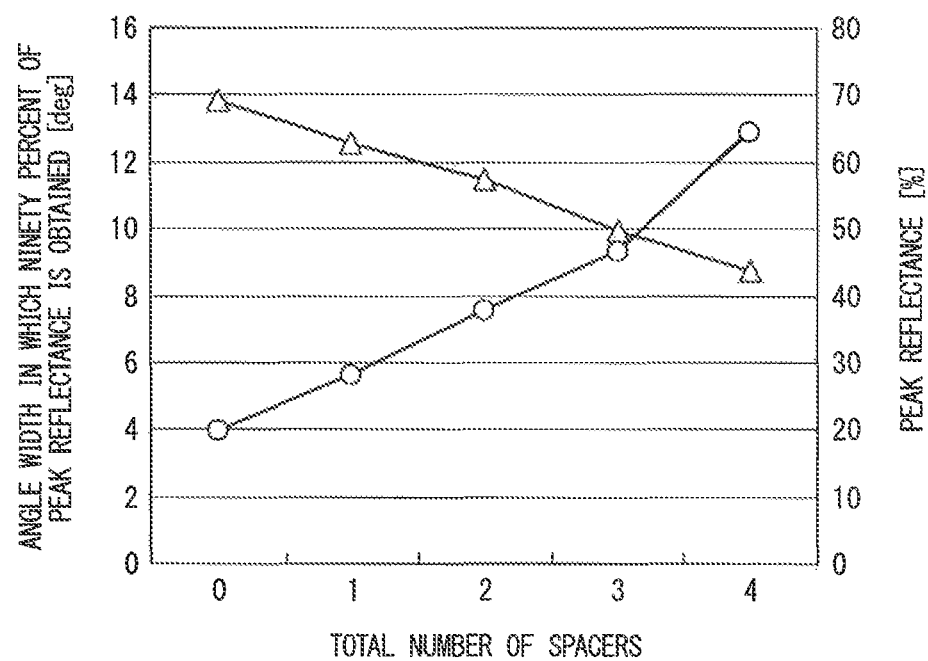
FIG. 4 is a graph showing the relationship between the number of spacer layers inserted in the multilayer film and an incident angle width, and the relationship between the number of spacer layers and peak reflectance.

FIG. 3 is a graph showing a relationship between an incident angle when light (non-polarized light) is incident and a reflectance with respect to five types of the multilayer film 1 to the multilayer film 5 shown in FIG. 2. The horizontal axis of the graph represents an incident angle (in degrees), and the vertical axis of the graph represents a reflectance (in %). Further, FIG. 4 is a graph showing a relationship between the total number of spacers included in the multilayer film and an angle width in which ninety percent of a peak reflectance is obtained. The horizontal axis of the graph represents the total number of spacers, and the vertical axis of the graph represents an angle width (in degrees).

As shown in FIG. 3, the multilayer film 1 has a substantially maximum reflectance (approximately 70%) when the incident angle is approximately 22°. On the other hand, the reflectance of the multilayer films 1 is gradually decreased along with a decrease in incident angle to less than 22° and along with art increase in incident angle to more than 22°. Further, as shown in FIG. 4, the angle width in which ninety percent of the peak reflectance is obtained is about 4°.

Further, the multilayer film 2 has a substantially maximum reflectance (approximately 62%) when the incident angle is approximately 20° to 22°. On the other hand, the reflectance of the multilayer film 2 gradually decreases along with a decrease in incident angle to less than 20° and along with an increase in incident angle to more than 22°. In this way, the multilayer film 2 maintains a substantially constant reflectance when the incident angle is 20° to 22°. The multilayer film 2 has a maximum value of reflectance which is smaller than that of the multilayer film 1; however, the incident angle range of the multilayer film 2, in which the reflectance is substantially maximized, is wider than that of the multilayer film 1. Further, as shown in FIG. 4, the angle width in which ninety percent of the peak reflectance is obtained is about 5.5°.

Further, the multilayer film 3 has a substantially maximum reflectance (approximately 58%) when the incident angle is approximately 18° to 23°. On the other hand, the reflectance of the multilayer film 3 is gradually decreased along with a decrease in incident angle to less than 18° and along with an increase in incident angle to more than 23°. In this way, the multilayer film 3 maintains a substantially constant reflectance when the incident angle is 18° to 23°. The multilayer film 3 has a maximum value of reflectance which is smaller than those of the multilayer film 1 and the multilayer film 2; however, the incident angle range of the multilayer film 3, in which the reflectance is substantially maximized, is wider than those of the multilayer film 1 and the multilayer film 2. Further, as shown in FIG. 4, the angle width in which ninety percent of the peak reflectance is Obtained is about 7.5°.

Further, the multilayer film 4 has a substantially maximum reflectance (approximately 50%) when the incident angle is approximately 17° to 24°. On the other hand, the reflectance of the multilayer film 4 is gradually decreased along with a decrease in incident angle to less than 17° and along with an increase in incident angle to more than 24°. In this way, the multilayer film 4 maintains a substantially constant reflectance when the incident angle is 17° to 24°. The multilayer film 4 has a maximum value of reflectance which is smaller than those of the multilayer film 1 to the multilayer film 3; however, the incident angle range of the multilayer film 4, in which the reflectance is substantially maximized, is wider than those of the multilayer film 1 to the multilayer film 3. Further, as shown in FIG. 4, the angle width in which ninety percent of the peak reflectance is obtained is about 9°.

Further, the multilayer film 5 has a substantially maximum reflectance (approximately 40 to 45%) when the incident angle is approximately 15° to 26°. On the other hand, the reflectance of the multilayer film 5 is gradually decreased along with a decrease in incident angle to less than 15° and along with an increase in incident angle to more than 26°. In this way, the multilayer film 5 maintains a substantially constant reflectance when the incident angle is 15° to 26°. The multilayer film 5 has a maximum value of reflectance which is smaller than those of the multilayer film 1 to the multilayer film 4; however, the incident angle range of the multilayer film 5, in which the reflectance is substantially maximized, is wider than those of the multilayer film 1 to the multilayer film 4. Further, as shown in FIG. 4, the angle width in which ninety percent of the peak reflectance is obtained is about 13°.

As shown in FIG. 2 to FIG. 4, two or more spacer layers 40 are inserted in the multilayer film 50 to thereby extend the incident angle range in which a light reflectance having a given ratio or more with respect to a maximum value of light reflectance in the multilayer film 50. Further, the peak reflectance of the multilayer film 50 is decreased in accordance with the increase in the number of the spacer layers 40; however, the angle width of incident angle, in which variation of reflectance is ten percent or less and a substantially constant reflectance is obtained, is drastically increased. When the incident angle range is further extended, the number of inserted spacer layers 40 may be increased.

When the multilayer film 50 configured as described above is formed, first, the multilayer film 50 is actually formed. Then, the reflectance properties of the formed multilayer film 50 are evaluated, and then the film structure of the multilayer film 50 is modified and adjusted such that the reflectance properties approach target properties.

In the present embodiment, the multilayer film 50 has a structure in which the spacer layers 40 having a layer thickness d4 are each inserted between the periodic blocks 60. Accordingly, the parameters for determining the structure of the multilayer film 50 are only three, that is, the thickness d1 of the first layer 10 included in the periodic block 60, the thickness d2 of the second layer 20 included in the periodic block 60, and the thickness d4 of the spacer layer 40. Therefore, since the three parameters may be adjusted, the adjustment to obtain the target reflectance properties can be easily made.

When the adjustment of the periodic block 60 are performed, for example, total 40 to 50 unit laminate structures 30 may be formed, and the reflectance peak angle position may be actually measured. Further, the adjustment of the periodic block 60 is easy since only the adjustment of the periodic length d should be made.

After finishing the adjustment of the periodic block 60, the thickness of the spacer layer 40 is adjusted, The multilayer film 50 in which the spacer layer 40 is inserted is formed to tailor the reflectance properties to fit the target properties, and thereby the reflectance properties can be made close to the target reflectance properties.

Figure 5:
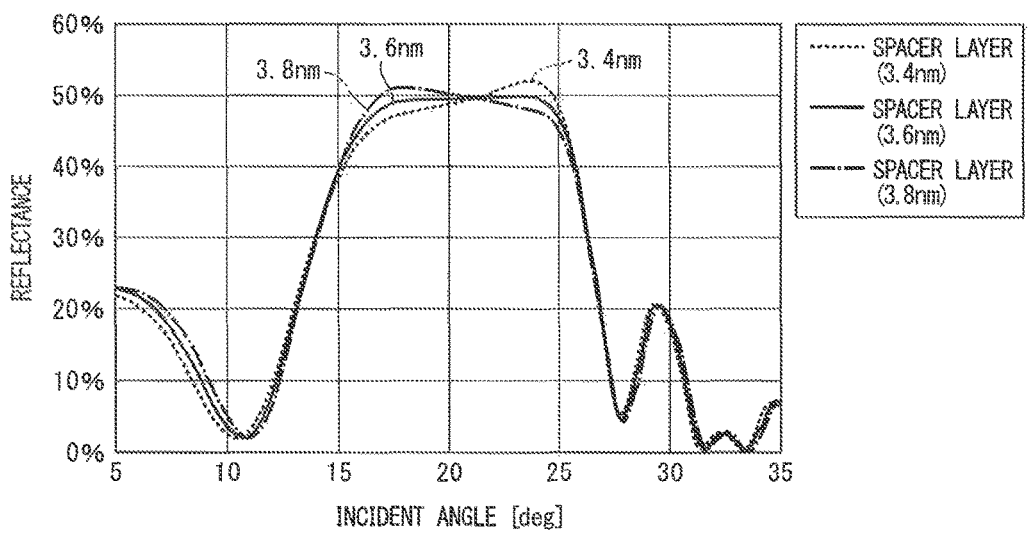
FIG. 5 is a diagram showing an example of a relationship between the incident angle of light with respect to a surface of a multilayer film and reflectance.

FIG. 5 is a graph showing a relationship between a reflectance and an incident angle when light (non-polarized light) is incident on a multilayer film having the same configuration as the multilayer film 4 shown in FIG. 2.

As shown in FIG. 5, when the thickness of the spacer layer included in the multilayer film 4 is 3.6 nm, the multilayer film 4 has a substantially constant reflectance (approximately 50%) in a predetermined incident angle range. On the other hand, when the thickness of the spacer layer is 3.4 nm, the reflectance on the high incident angle side of the above range is large (approximately 53%), and the light reflectance on the low incident angle side is small (approximately 47%).

As shown in FIG. 5, the deviation of the thickness of the spacer layer 40 has an effect on the slope of the peak part of reflectance. Therefore, it is possible to easily determine how the thickness of the spacer layer 40 may be adjusted in order to obtain the target angle distribution of reflectance by using the evaluation result of the reflectance as shown in FIG. 5.

Figure 6:
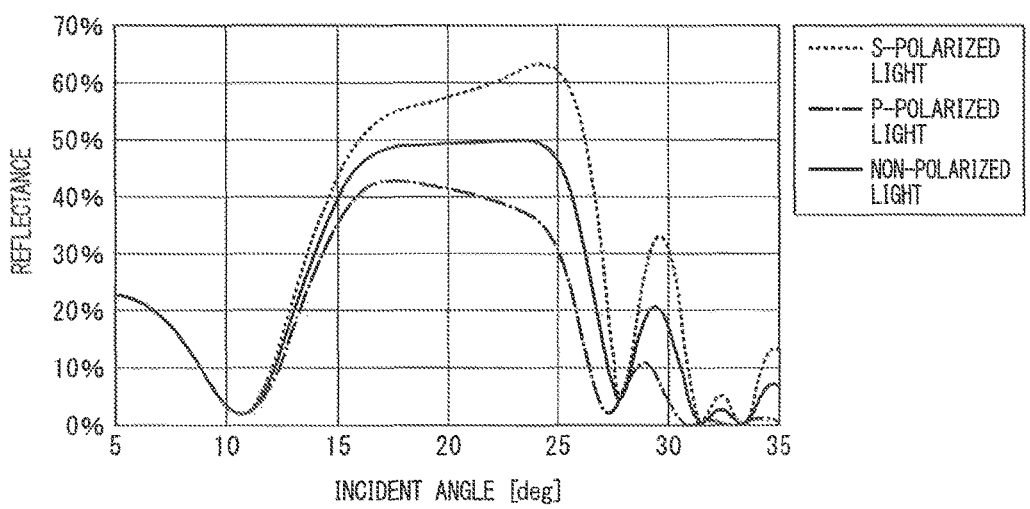
FIG. 6 is a diagram showing an example of a relationship between the incident angle of light with respect to a surface of a multilayer film and reflectance.
Figure 7:
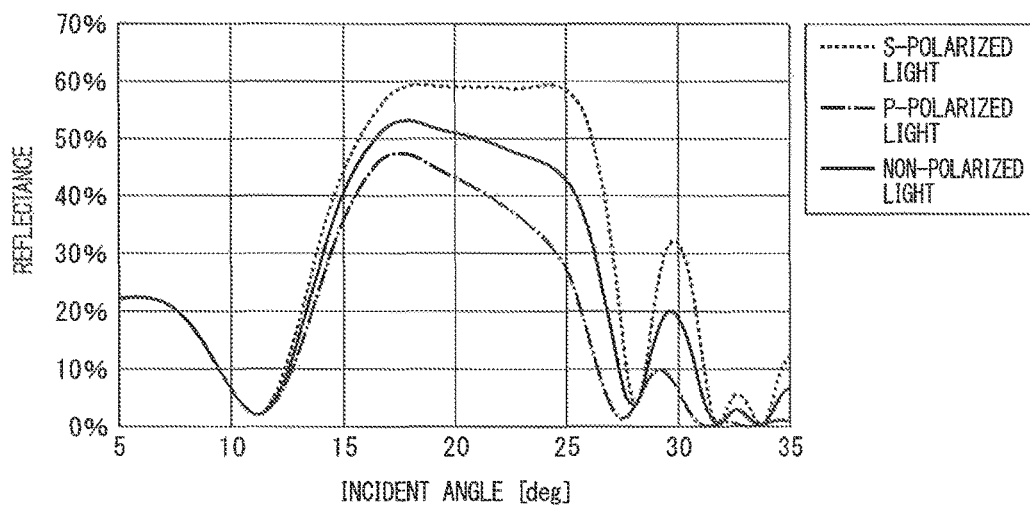
FIG. 7 is a diagram showing an example of a relationship between the incident angle of light with respect to a surface of a multilayer film and reflectance.
Figure 8:
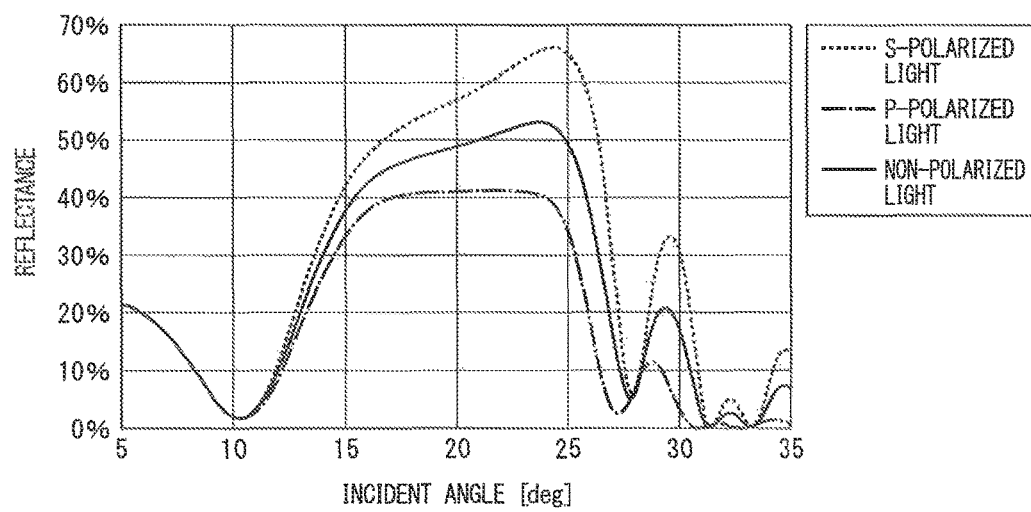
FIG. 8 is a diagram showing an example of a relationship between the incident angle of light with respect to a surface of a multilayer film and reflectance.

Further, when the incident light is not non-polarized light but S-polarized light or P-polarized light, the relationship between the incident angle of light and the reflectance of the multilayer film 50 is different. FIG. 6 to FIG. 8 are graphs showing a relationship between the incident angle and the reflectance when non-polarized light, S-polarized light, and P-polarized light are incident on the multilayer film 50. The horizontal axis of the graph represents an incident angle (in degrees), and the vertical axis of the graph represents reflectance (in %).

The properties shown in FIG. 6 are properties when the thickness of the spacer layer 40 is 3.6 nm in the same configuration as the above multilayer film 4.

As shown in FIG. 6, when the thickness of the spacer layer 40 is 3.6 nm, non-polarized light is incident on the multilayer film 50, and thereby a substantially constant reflectance (approximately 50%) can be obtained in a predetermined angle range (for example, 15° to 25°).

The properties shown in FIG. 7 are properties when the thickness of the spacer layer 40 is 4.0 nm in the same configuration as the above multilayer film 4.

As shown in FIG. 7, when the thickness of the spacer layer 40 is 4.0 nm, S-polarized light is incident on the multilayer film 50, and thereby a substantially constant reflectance (approximately 60%) can be obtained in a predetermined angle range (for example, 15° to 25°). When S-polarized light is incident on the multilayer film 50, the obtained reflectance is higher than the case of non-polarized light.

The properties shown in FIG. 8 are properties when the thickness of the spacer layer 40 is 3.3 nm in the same configuration as the above multilayer film 4.

As shown in FIG. 8, when the thickness of the spacer layer 40 is 3.3 nm, P-polarized light is incident on the multilayer film 50, and thereby a substantially constant reflectance (approximately 40%) can be obtained in a predetermined angle range (for example, 15° to 25°).

In this way, design can be made depending on the polarization of incident light.

Next, the reason why a constant reflectance can be obtained in a wide angle range by inserting the plurality of spacer layers 40 in the multilayer film 50 is described.

Figure 9:
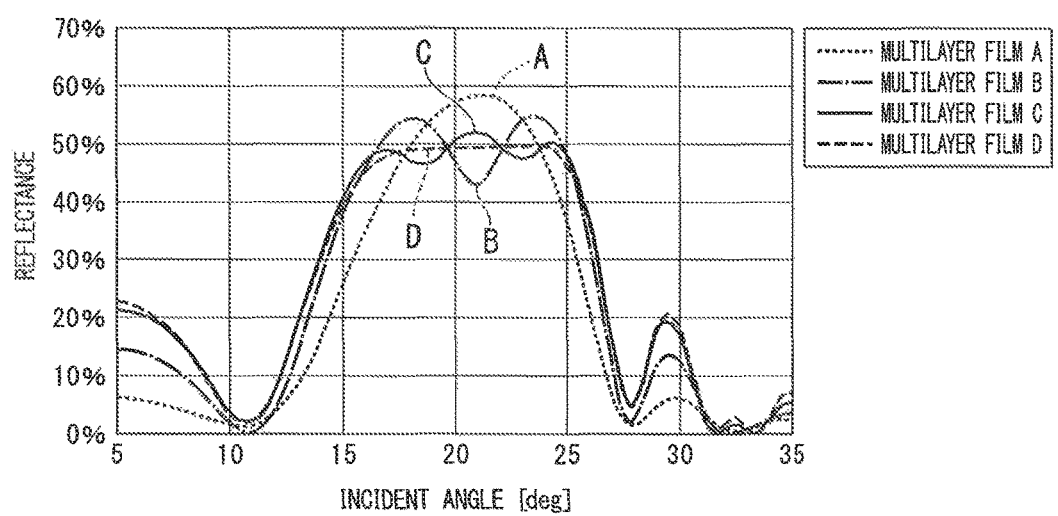
FIG. 9 is a diagram showing an example of a relationship between the incident angle of light with respect to a surface of a multilayer film and reflectance.

FIG. 9 shows a reflectance with respect to four types of multilayer films (multilayer films A to D).

The multilayer film A includes no spacer layer. Therefore, the multilayer film A includes one periodic block. Further, the total number of unit laminate structures included in the periodic block is 20.

The multilayer film B includes one spacer layer, Therefore, the multilayer film B includes two periodic blocks. The total number of unit laminate structures included in the periodic block on the surface side of the multilayer film B is 20. Further, the total number of unit laminate structures included in the periodic block arranged on the base S side is 9. Further, the layer thickness of the spacer layer is 3.6 nm.

The multilayer film C includes two spacer layers. Therefore, the multilayer film C includes three periodic blocks. The total number of unit laminate structures included in the periodic block on the surface side of the multilayer film C is 20. Further, the total number of unit laminate structures included in the second periodic block from the upper layer of the multilayer film C is 9. Further, the total number of periodic blocks arranged on the base S side is 6. Further, the layer thicknesses of the two spacer layers are all 3.6 nm.

The multilayer film D includes three spacer layers. Therefore, the multilayer film D includes four periodic blocks. The total number of unit laminate structures included in the periodic block on the surface side of the multilayer film D is 20. Further, the total number of unit laminate structures included in the second periodic block from the upper layer of the multilayer film D is 9. Further, the total number of unit laminate structures included in the third periodic block from the upper layer of the multilayer film D is 6. Further, the total number of periodic blocks arranged on the base S side is 2. Further, the layer thicknesses of the three spacer layers are all 3.6 nm.

Hereinafter, with respect to multilayer films A to D, a configuration corresponding to the configuration of the above multilayer film 50 is imparted by the same reference numeral and is described. As shown in FIG. 9, the multilayer film A has reflectance properties similar to the reflectance properties of a regular periodic multilayer film. Nine unit laminate structures 30 are inserted between the base S and the multilayer film A to interpose the spacer layer 40 between the nine unit laminate structures 30 and the multilayer film A, and thereby the multilayer film B is formed. In the multilayer film B, the reflectance at angles close to the peak angle is decreased, and the reflectance at angles at the periphery of the angles close to the peak angle is increased more than the multilayer film A.

This phenomenon is described. When the multilayer film is a periodic structure, at an angle close to the peak angle (for example, 21.3°), the reflected lights from all interfaces from the uppermost surface to an interface closest to the base S are in phase. Therefore, as the number of unit laminate structures 30 is increased, the reflectance is increased. However, every material has absorption of EUV light, and therefore there is an upper limit in the number of layers that contribute to reflection. As an example, when EUV light having a wavelength of about 13.5 nm is incident on a Mo/Si multilayer film, the upper limit in the total number of unit laminate structures 30 is about 50.

When a spacer layer 40 having a thickness of 3.6 nm is sandwiched between the unit laminate structures 30, the reflected wave at the upper side of the spacer layer 40 is shifted by 180° in phase from the reflected wave at the lower side of the spacer layer 40, Accordingly, as the periodic block 60 (nine unit laminate structures 30) is inserted on the base S side, reflected waves of inverted phases overlap each other, and the peak reflectance is decreased.

At incident angles (about 17° and about 24°) at the periphery of the peak, reflected waves reflected at the interfaces do not completely coincide in phase with each other, and the shift in phase is increased as the number of unit laminate structures 30 increases. When the number of unit laminate structures 30 exceeds a given number, the reflectance begins to decrease. However, the phase of the reflected waves is matched with the phase of the reflected wave reflected by the periodic block 60 (nine unit laminate structures 30) inserted to sandwich the spacer layer 40, and thereby the reflectance increases.

In this way, by adding the periodic block 60 to sandwich the spacer layer 40, the reflected lights are matched in phase with each other. At this time, the spacer layer 40 is used as an adjustment layer that adjusts a phase shift of light reflected by the multilayer film 50. Further, when the periodic block 60 is added, there exists an incident angle at which the reflected lights are matched in phase with each other and thereby the reflectance is increased or an incident angle at which the reflected lights are shifted in phase from each other and thereby the reflectance is decreased. Accordingly, by further inserting the periodic block 60 to sandwich the spacer layer 40, it is possible to balance the reflectance in a predetermined angle range, and it is possible to finally obtain a substantially constant reflectance in a wide angle range.

As described above, according to the present embodiment, since the optical element 100 is provided with: the base S; the multilayer film 50 which is provided on the base S and in which the plurality of unit laminate structures 30 are laminated, each laminate structure having the first layer 10 and the second layer 20 provided on the first layer 10; and the plurality of spacer layers 40 which are each provided at a different one of a plurality of interlaminar positions located between the unit laminate structures 30, it is possible to obtain the optical element 100 capable of obtaining a substantially constant reflectance in a wide angle range and having a multilayer film with a film structure that is easily modified and adjusted.

[Exposure Apparatus]

Figure 10:
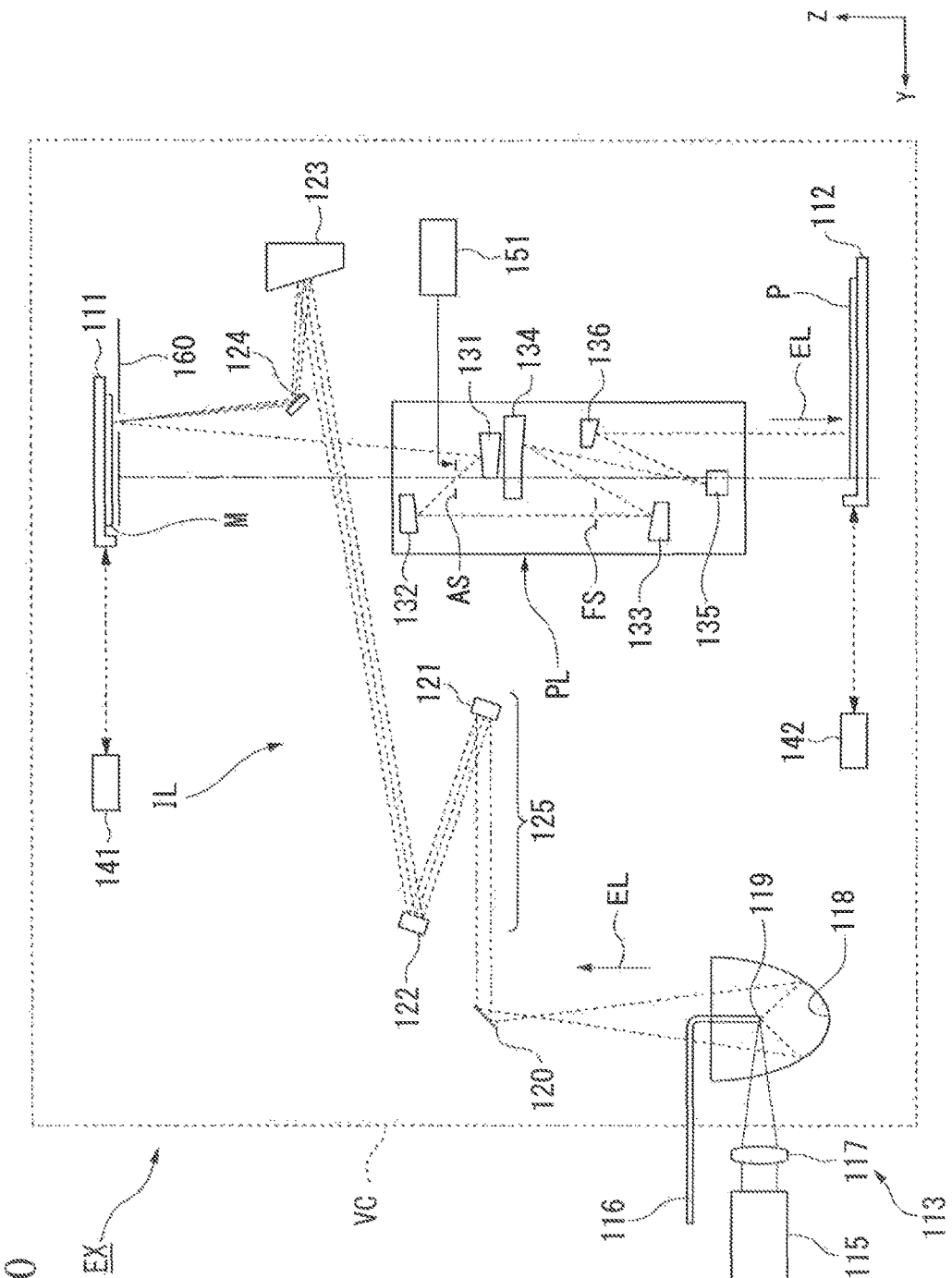
FIG. 10 is a diagram showing an example of an exposure apparatus according to the present embodiment.

FIG. 10 is a diagram showing an example of an exposure apparatus EX according to the present embodiment. The exposure apparatus EX of the present embodiment is an EUV exposure apparatus that exposes a substrate P with EUV light. The optical element 100 described above is used as an optical system of the EUV exposure apparatus EX according to the present embodiment.

In FIG. 10, the exposure apparatus EX is provided with a mask stage 111 capable of moving while holding a mask M, a substrate stage 112 capable of moving while holding the substrate P onto which exposure light EL is irradiated, a light source apparatus 113 which generates light (exposure light) EL which includes EUV light, an illumination optical system IL that illuminates the mask M held by the mask stage 111 with the exposure light EL emitted from a light source apparatus 113, a projection optical system PL that projects an image of a pattern of the mask M illuminated by the exposure light EL onto the substrate P, and a chamber apparatus VC that has a vacuum system in which a predetermined space through which at least the exposure light EL passes is formed and the predetermined space is put into a vacuum state (for example, $1.3 \times 10^{-3}$ Pa or less).

The substrate P includes a substrate in which a photosensitive film is formed on a base such as a semiconductor wafer. The mask M includes a reticle in which a device pattern projected onto the substrate P is formed. In the present embodiment, EUV light is used as the exposure light EL, and the mask M is a reflective mask which has a multilayer film capable of reflecting EUV light. The multilayer film of the reflective mask includes, for example, a Mo/Si multilayer film, and a Mo/Be multilayer film. The exposure apparatus EX illuminates the reflection surface (pattern formation surface) of the mask M in which the multilayer film is formed with the exposure light EL and exposes the substrate P with reflected light of the exposure light EL reflected by the mask M.

The light source apparatus 113 of the present embodiment is a laser-excited plasma light source apparatus and includes a laser apparatus 115 that emits laser light and a supply member 116 that supplies a target material such as a xenon gas. The laser apparatus 115 generates laser light having a wavelength in the infrared region and in the visible region.

The laser apparatus 115 includes, for example, a YAG laser using semiconductor laser excitation, an excimer laser, a carbon dioxide laser, or the like.

Further, the light source apparatus 113 is provided with a first light-collection optical system 117 that collects laser light emitted from the laser apparatus 115. The first light-collection optical system 117 collects laser light emitted from the laser apparatus 115 at a position 119. The supply member 116 has a supply port that supplies the target material to the position 119. The laser light collected by the first light-collection optical system 117 is irradiated onto the target material supplied from the supply member 116. The target material irradiated with the laser light is heated to a high temperature due to the energy of the laser light to be excited into a plasma state. When the target material transitions to a low potential state, the target material generates light including EUV light. Note that, the light source apparatus 113 may be a discharge plasma light source apparatus.

The light source apparatus 113 generates light (EUV light) that has a spectrum in the extreme ultraviolet region. The exposure apparatus EX is provided with a second light-collection mirror 118 arranged at the periphery of the position 119. The second light-collection mirror 118 includes an elliptical mirror. The second light-collection mirror 118 that includes the elliptical mirror is arranged such that a first focal point of the second light-collection mirror 118 and the position 119 are substantially matched with each other.

The EUV light (exposure light) EL collected at a second focal point by the second light-collection mirror 118 is supplied to the illumination optical system IL. The illumination optical system IL includes a plurality of optical elements 120, 121, 122, 123, 124 to which the exposure light EL from the light source apparatus 113 is supplied and illuminates the mask M with the exposure light EL from the light source apparatus 113. At least one of the optical elements 120, 121, 122, 123, 124 of the illumination optical system IL may be the optical element 100 described above.

The optical element 120 of the illumination optical system IL is a third light-collection mirror that functions as a collimator mirror, and the exposure light EL from the second light-collection mirror 118 is supplied to the optical element 120. The exposure light EL from the second light-collection mirror 118 is guided to the third light-collection mirror 120.

The third light-collection mirror 120 includes a parabolic mirror. The third light-collection mirror 120 is arranged such that the focal point of the third light-collection mirror 120 and the second focal point of the second light-collection mirror 118 are substantially matched with each other.

In addition, the illumination optical system IL has an optical integrator 125. In the present embodiment, the optical integrator 125 includes a reflective fly eye mirror optical system.

The reflective fly eye mirror optical system 125 includes an incident fly eye mirror 121 and an exit fly eye mirror 122. The third light-collection mirror 120 supplies the exposure light EL to the incident fly eye mirror 121 of the fly eye mirror optical system 125 in a state where the exposure light EL is substantially collimated.

The incident fly eye mirror 121 includes a plurality of unit mirrors (reflection element group) having arc reflection surfaces substantially similar to illumination fields arranged in parallel with each other as disclosed in, for example, U.S. Pat. No. 6,452,661, and the like. The incident fly eye mirror 121 is arranged at a position optically conjugate with the reflection surface of the mask M and the surface of the substrate P or in the vicinity of the position.

Further, the exit fly eye mirror 122 includes a plurality of unit mirrors (reflection element group) corresponding to the plurality of unit mirrors of the incident fly eye mirror 121. The unit mirrors of the exit fly eye mirror 122 have a rectangular shape and are arranged in parallel with one another. The exit fly eye mirror 122 is arranged at a position optically conjugate with the pupil position of the projection optical system PL or in the vicinity of the position.

The collimated light from the third light-collection mirror 120 is incident on the incident side fly eye mirror 121, and the wave front of the light is split by the incident fly eye mirror 121. Each of the unit mirrors of the incident fly eye mirror 121 collects the incident light and forms a plurality of light collection points (light source image). One of a plurality of unit mirrors of the exit fly eye mirror 122 is provided at a position close to each of the positions where the plurality of light collection points are formed. A plurality of light collection points (secondary light source) in accordance with the number of unit mirrors of the exit fly eye mirror 122 are formed on the exit surface of the exit fly eye mirror 122 or in the vicinity of the exit surface.

Further, the illumination optical system IL has a condenser mirror 123. The condenser mirror 123 is arranged such that a focal position of the condenser mirror 123 and the position in the vicinity of the secondary light source formed by the fly eye mirror optical system 125 are substantially matched with each other. The light from the secondary light source formed by the fly eye mirror optical system 125 is reflected and collected by the condenser mirror 123 and is supplied to the mask M via an optical path bending mirror 124.

In this way, the illumination optical system IL including the plurality of optical elements 120 to 124 uniformly illuminates an illumination region on the mask M with the exposure light EL emitted from the light source apparatus 113. The exposure light EL illuminated by the illumination optical system IL and reflected by the mask M is incident to the projection optical system PL.

Note that, in order to spatially separate the optical path of the light supplied to the mask M and the optical path of the light reflected by the mask M to be incident on the projection optical system PL, the illumination optical system IL of the present embodiment is a non-telocentric; system, Further, the projection optical system PL also a mask side non-telecentric system.

The mask stage 111 is a stage of six degrees of freedom, which is capable of moving in six directions that are the X-axis, Y-axis, Z-axis, and θX, θY and θZ directions, while holding the mask M. In the present embodiment, the mask stage ill holds the mask M such that the reflection surface of the mask M and the XY plane are substantially parallel with each other. The position information of the mask stage 111 (mask M) is measured by a laser interferometer 141. The laser interferometer 141 measures position information relating to the X-axis, Y-axis, and θZ direction of the mask stage 111 using a measurement minor provided in the mask stage 111.

Further, surface position information of the surface of the mask M held by the mask stage 111 (position information relating to the Z-axis, θX, and θY) is detected by a focus leveling detection system (not shown). The position of the mask M held by the mask stage 111 is controlled based on the measurement result by the laser interferometer 141 and the detection result by the focus leveling detection system.

Further, the exposure apparatus EX of the present embodiment is provided with a blind member 160 that is provided at a position opposite to at least part of the reflection surface of the mask M and limits the illumination region of the exposure light EL on the reflection surface of the mask M as disclosed in, for example, Japanese Unexamined Patent Application, Publication No. 2004-356415A, and the like. The blind member 160 has an opening through which the exposure light EL can pass and defines the illumination region of the exposure light EL on the reflection surface of the mask M.

The projection optical system PL includes a plurality of optical elements 131, 132, 133, 134, 135, 136 to which the exposure light EL from the mask M is supplied and projects an image of the pattern of the mask M illuminated by the exposure light EL onto the substrate P. At least one of the optical elements 131, 132, 133, 134, 135, 136 of the projection optical system PL may be the optical element 100 described above.

The projection optical system PL is provided with a first mirror pair including a first reflection mirror 131 having a reflection surface with a concave surface and a second reflection mirror 132 having a reflection surface with a concave surface, a second mirror pair including a third reflection mirror 133 having a reflection surface with a predetermined shape and a fourth reflection mirror 134 having a reflection surface with a concave surface, and a third mirror pair including a fifth reflection mirror 135 having a reflection surface with a convex surface and a sixth reflection mirror 136 having a reflection surface with a concave surface.

In each of the mirror pairs, the first reflection mirror 131, the third reflection mirror 133, and the fifth reflection mirror 135 are each arranged such that the reflection surface faces the object plane side (mask M side) of the projection optical system PL, and the second reflection mirror 132, the fourth reflection mirror 134, and the sixth reflection mirror 136 are each arranged such that the reflection surface faces the image plane side (substrate P side) of the projection optical system PL.

The exposure light EL from the mask M forms an intermediate image after being reflected by the first mirror pair in order of the first reflection mirror 131 and the second reflection mirror 132. The light from the intermediate image is reflected by the second mirror pair in order of the third reflection mirror 133 and the fourth reflection mirror 134. The light reflected by the second mirror pair is reflected by the third mirror pair in order of the fifth reflection mirror 135 and the sixth reflection mirror 136 to be guided to the substrate P. A field stop FS that limits the projection region on the substrate P is arranged at a position where the intermediate image is formed.

An aperture stop AS that limits the numerical aperture NA of the projection optical system FL is arranged between the first reflection mirror 131 and the second reflection mirror 132 of the first mirror pair. The aperture stop AS has an opening with a variable size (diameter). The size (diameter) of the opening is controlled by an aperture stop control unit 151.

The substrate stage 112 is a stage of six degrees of freedom. which is capable of moving in six directions that are the X-axis, Y-axis, Z-axis, and θX, θY, and θZ directions, while holding the substrate P. In the present embodiment, the substrate stage 112 holds the substrate P such that the surface of the substrate P and the XY plane are substantially parallel with each other. Position information of the substrate stage 112 (substrate P) is measured by a laser interferometer 142. The laser interferometer 142 measures position information relating to the X-axis, Y-axis and θZ direction of the substrate stage 112 using a measurement mirror provided in the substrate stage 112. Further, surface position information (position information relating to the Z-axis, θX, and θY) of the surface of the substrate P held by the substrate stage 112 is detected by the focus leveling detection system (not shown).

The position of the substrate P held by the substrate stage 112 is controlled based on the measurement result by the laser interferometer 142 and the detection result by the focus leveling detection system.

When exposing the substrate P, the substrate stage 112 that holds the substrate P is moved in the Y-axis direction in synchronization with the movement of the mask stage 111 that holds the mask M in the Y-axis direction while the illumination optical system IL illuminates a predetermined illumination region on the mask M with the exposure light EL. Thereby, the image of the pattern of the mask M is projected onto the substrate P via the projection optical system PL.

As described above, according to the present embodiment, since the optical element 100 is used in at least one of the illumination optical system IL and the projection optical system PL of the EUV exposure apparatus EX according to the present embodiment, it is possible to reflect the light EL incident on the optical system at a high reflectance. Accordingly, an exposure apparatus EX having an illumination optical system IL and a projection optical system PL that represent good reflection properties can be obtained.

When the optical element 100 is used for the illumination optical system IL and the projection optical system PL, the optical element 100 can be used as an optical element reflecting the light EL of the widest incident angle range. Thereby, good reflection properties can be obtained.

Further, when the optical element 100 is used for the illumination optical system IL and the projection optical system PL, the optical element 100 can be used also as an optical element provided at a position, for example, where the incident angle of the light EL is the largest.

Figure 11:
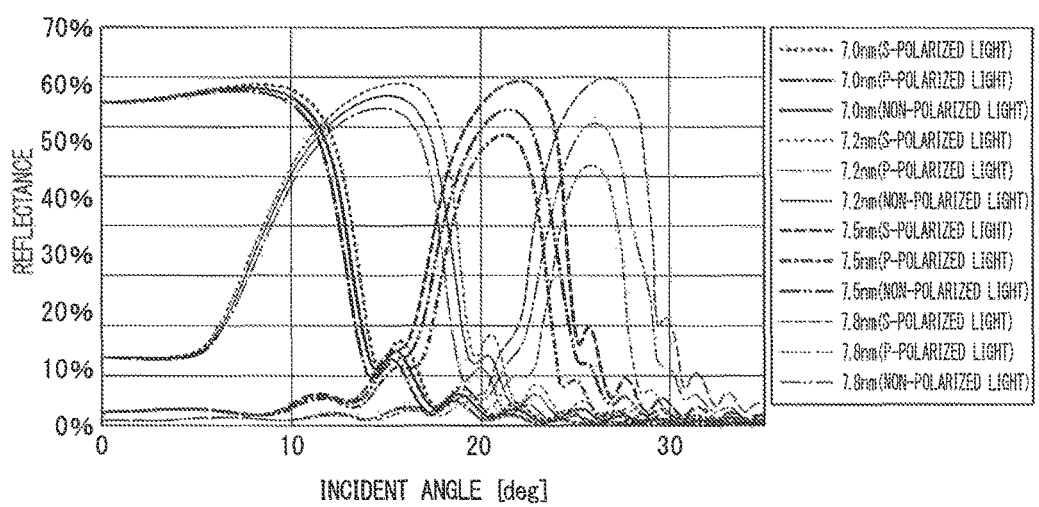
FIG. 11 is a graph showing an incident angle dependence of reflectance of a Mo/Si multilayer film (50 pairs of layers) having a periodic structure.

FIG. 11 is a graph showing an incident angle dependence of reflectance of a Mo/Si multilayer film (50 pairs of layers) having a periodic structure. The horizontal axis of the graph represents an incident angle (in degrees), and the vertical axis represents a reflectance (in %). In the graph of FIG. 11, examples of S-polarized light, P-polarized light, and non-polarized light having a wavelength of 7.0 nm to 7.8 nm are shown. As shown in FIG. 11, the peak of reflectance of the multilayer film 50 is narrower in width as the incident angle is larger. Therefore, the optical element (reflection mirror) provided at a position having a large incident angle of the light EL may be required, for example, to reflect wideband light even if an incident angle range capable of reflecting the light at a high reflectance is narrow From such a viewpoint, when the optical element 100 is used, by using the optical element 100 as an optical element provided at a position where the incident angle of the light EL is the largest as described above, good reflection properties are obtained.

The above embodiments are described using an example where the multilayer film 50 is an Mo/Si multilayer film; however, for example, it is possible to change the material that forms the multilayer film 50 according to the wavelength band of the BUY light. For example, when BUY light having a wavelength band close to 11.3 nm is used, it is possible to obtain a high reflectance by using an Mo/Be multilayer film in which a molybdenum layer (Mo layer) and a beryllium layer (Be layer) are alternately laminated.

Further, in the embodiments described above, ruthenium (Ru), molybdenum carbide ($Mo_2C$), molybdenum oxide ($MoO_2$), molybdenum silicide ($MoSi_2$), and the like may be used as the material for forming the first layer 10 of the multilayer film 50. Further, it is possible to use silicon carbide (SiC) as the material that forms the second layer 20 of the multilayer film 50.

In addition to a semiconductor wafer for manufacturing a semiconductor device, a glass substrate for a display device, a ceramic wafer for a thin-film magnetic head, an original plate (synthetic quartz or silicon wafer) of a mask or a reticle used in the exposure apparatus, or the like may be applied as the substrate P in the embodiment described above.

In addition to a scan type exposure apparatus of step-and-scan type (scanning stepper) in which the mask M and the substrate P are synchronously moved to scan-expose the pattern of the mask M, a step-and-repeat type projection exposure apparatus (stepper) in which the pattern of the mask M is exposed in a batch in a state where the mask M and the substrate P are stationary and the substrate P is moved stepwise in sequence can be used as the exposure apparatus EX.

Furthermore, in the step-and-repeat type exposure, after a reduced image of a first pattern is transferred onto the substrate P by using the projection optical system in a state where the first pattern and the substrate P are substantially stationary, a reduced image of a second pattern may be exposed in a batch onto the substrate P, the reduced image of the second pattern being partially overlapped on the first pattern, by using the projection optical system in a state where the second pattern and the substrate P are substantially stationary (a stitch type batch exposure apparatus). Further, it is also possible to apply the stitch type exposure apparatus to a step-and-stitch type exposure apparatus that transfers at least two patterns onto the substrate P in a partially overlapping manner and moves the substrate P in sequence.

Further, for example, it is also possible to apply the present invention to an exposure apparatus that combines patterns of two masks on a substrate via a projection optical system and double exposes a single shot region on the substrate at substantially the same time according to a single scan exposure as disclosed in U.S. Pat. No. 6,611,316, or the like.

Further, it is also possible to apply the present invention to a twin stage type exposure apparatus provided with a plurality of substrate stages as disclosed in U.S. Pat. Nos. 6,341,007, 6,400,441, 6,549,269, 6,590,634, 6,208,407, 6,262,796, and the like.

Furthermore, for example, it is also possible to apply the present invention to an exposure apparatus provided with a substrate stage that holds a substrate and a measurement stage including a fiducial member in which a fiducial mark is formed and/or various photoelectric sensors as disclosed in U.S. Pat. No. 6,897,963 and the like. Further, it is possible to apply the present invention to an exposure apparatus provided with a plurality of substrate stages and measurement stages.

The types of the exposure apparatuses EX are not limited to exposure apparatuses for manufacturing semiconductor elements that expose semiconductor element patterns onto a substrate P, and the exposure apparatuses EX are widely applicable to exposure apparatuses for manufacturing liquid crystal display elements or for manufacturing displays and exposure apparatuses for manufacturing thin-film magnetic heads, image capture elements (CCD), micromachines, MEMS, DNA chips, reticles, masks, and the like.

The exposure apparatus EX of the present embodiment is manufactured by assembling various subsystems including each of the constituent elements listed in the claims no as to maintain a predetermined mechanical accuracy; electrical accuracy, and optical accuracy. In order to ensure these accuracies, adjustments to achieve the optical accuracy for the various optical systems, adjustments to achieve the mechanical accuracy for the various mechanical systems, and adjustments to achieve the electrical accuracy for the various electrical systems are performed before and after this assembly. The process of assembling the various subsystems into the exposure apparatus includes mechanical connections, wiring connections of electrical circuits, piping connections of air pressure circuits, and the like between the various subsystems. Before the process of assembling the various subsystems into the exposure apparatus, individual assembly processes for each of the subsystems are performed. When the assembly processes of the various subsystems into the exposure apparatus are finished, comprehensive adjustment is performed, and the various accuracies are ensured for the exposure apparatus as a whole. Note that, the manufacturing of the exposure apparatus can be performed in a clean room where the temperature, the cleanliness, and the like are controlled.

[Device Manufacturing Method]

Figure 12:
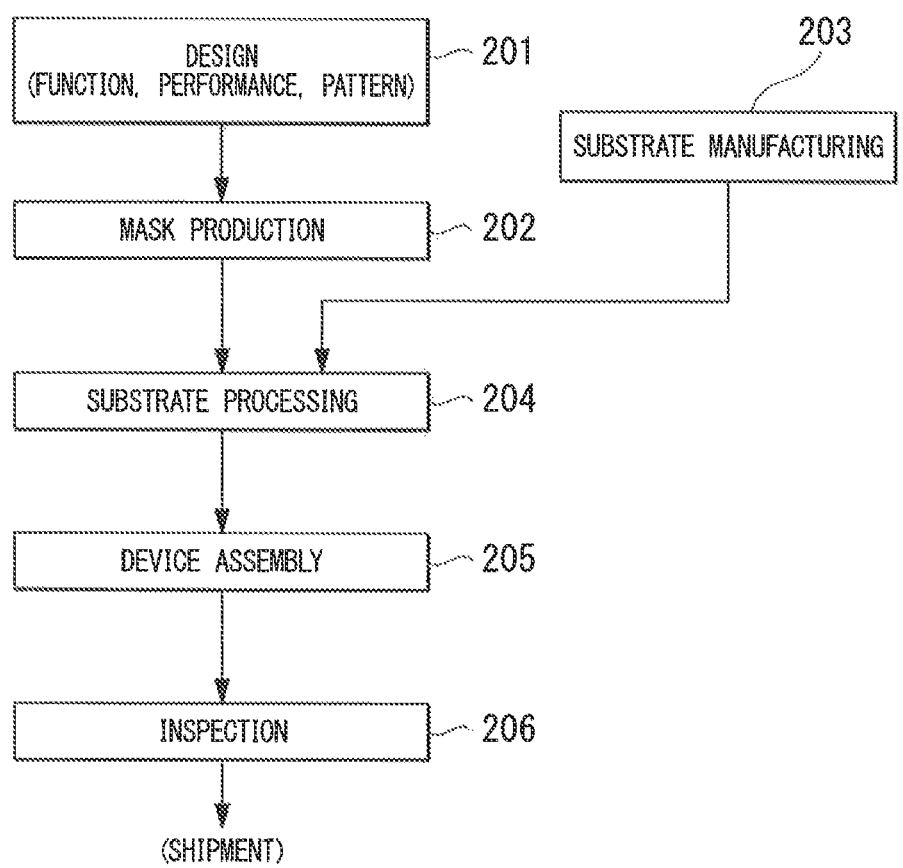
FIG. 12 is a flowchart for describing an example of a device manufacturing method according to the present embodiment.

As shown in FIG. 12, devices such as semiconductor devices are manufactured through: a step 201 of performing function and performance design for the device, a step 202 of producing the mask (reticle) based on this design step, a step 203 of manufacturing the substrate which is a base of the device, a substrate processing step 204 of including substrate processing (exposure processing) including: exposing the substrate P with exposure light from the pattern of the mask; and developing the exposed substrate according to the embodiment described above, a device assembly step (including treatment process such as a dicing process, a bonding process, and a packaging process) 205, an inspection step 206, and the like.

The requirements of the embodiments described above can be combined as appropriate. Further, there may be cases where some constituent elements are not used. Further, the disclosures of all of the Patent Publications and United States Patents relating to apparatuses or the like cited in the embodiments and modified examples described above are incorporated by reference as part of the description to the extent permitted by law.

The technical scope of the present invention is not limited to the above embodiments, and modifications can be appropriately made without departing from the scope of the present invention.

For example, as shown in FIG. 1, a configuration may be used in which a diffusion suppression layer 70 that suppresses diffusion of a material constituting the first layer 10 and the second layer 20 is provided between the first layer 10 and the second layer 20. Further, a configuration may be used in which an oxidation suppression layer 80 is provided at the outward layer of the multilayer film 50.

What is claimed is:

1. An optical element comprising:
   a base;
   an EUV reflective multilayer film which is provided on the base and in which a plurality of unit laminate structures are laminated, each laminate structure having a first layer and a second layer provided on the first layer, the first layer is formed of a material having a large difference between a refractive index with respect to EUV light and the refractive index of vacuum and the second layer is formed of a material having a small difference between a refractive index with respect to EUV light and the refractive index of vacuum; and
   at least two or more spacer layers which are each provided at a different one of a plurality of interlaminar positions located between the unit laminate structures,
   wherein the plurality of unit laminate structures is divided by the at least two or more spacer layers into a plurality of periodic blocks including a first periodic block arranged on a surface side, a second periodic block arranged on the base side, and a plurality of intermediate periodic blocks arranged between the first periodic block and the second periodic block;
   a number of the unit laminate structures included in the first periodic block is larger than a number of the unit laminate structures included in the second periodic block and numbers of the unit laminate structures included in the plurality of intermediate periodic blocks;
   the number of the unit laminate structures included in the plurality of intermediate periodic blocks are larger than the number of the unit laminate structures included in the second periodic block;
   wherein the at least two or more spacer layers adjust a phase shift of light which is reflected by the multilayer film; and
   as a number of spacer layers increases the peak of reflectance of the EUV reflective multilayer decreases.

2. The optical element according to claim 1, wherein the spacer layer is an adjustment layer that includes a material having an extinction coefficient which is smaller than that of a material constituting the multilayer film in a wavelength of EUV light reflected by the multilayer film.

3. The optical element according to claim 1, wherein the at least two or more spacer layers are formed having the same thickness.

4. The optical element according to claim 1, wherein the spacer layer is formed with a thickness that is a factor of a thickness of the unit laminate structure.

5. The optical element according to claim 1, wherein the spacer layer is formed with a thickness of ⅓ to ⅔ of a thickness of the unit laminate structure.

6. The optical element according to claim 1, wherein the number of the unit laminate structures included in the first periodic block is 1.5 times or more of the number of the unit laminate structures included in the second periodic block and the plurality of intermediate periodic blocks.

7. The optical element according to claim 1, wherein a diffusion suppression layer that suppresses diffusion of a material constituting the first layer and the second layer is provided between the first layer and the second layer.

8. The optical element according to claim 1, wherein the multilayer film has an oxidation suppression layer provided at an outward layer.

9. A projection optical system having a plurality of reflection elements and configured to project an image of a first surface on a second surface, wherein
   at least one of the plurality of reflection elements is an optical element according to claim 1.

10. The projection optical system according to claim 9, wherein
    light from the first surface is irradiated onto the second surface via a plurality of the reflection elements, and
    one or more of the plurality of reflection elements is the optical element, the one or more being one of a reflection element reflecting light of incident angle range greater than a target range or a reflection element reflecting light with angle of incidence larger than a target angle.

11. An exposure apparatus configured to expose a substrate with exposure light, wherein
    the exposure apparatus comprises an optical element according to claim 1.

12. A device manufacturing method comprising:
    exposing a substrate using the exposure apparatus according to claim 11; and developing the exposed substrate.

* * * * *